(12) United States Patent
Kim

(10) Patent No.: US 8,471,305 B2
(45) Date of Patent: Jun. 25, 2013

(54) SEMICONDUCTOR DEVICE AND METHOD OF MANUFACTURING THE SAME

(75) Inventor: Do Hyung Kim, Seoul (KR)

(73) Assignee: Hynix Semiconductor Inc., Icheon (KR)

( * ) Notice: Subject to any disclaimer, the term of this patent is extended or adjusted under 35 U.S.C. 154(b) by 60 days.

(21) Appl. No.: 12/842,332

(22) Filed: Jul. 23, 2010

(65) Prior Publication Data

US 2011/0133261 A1    Jun. 9, 2011

(30) Foreign Application Priority Data

Dec. 4, 2009  (KR) .................. 10-2009-0120159

(51) Int. Cl.
*H01L 27/108*   (2006.01)

(52) U.S. Cl.
USPC .......................................... 257/253; 257/302

(58) Field of Classification Search
USPC ............................. 257/328, 330, E27.091, 296
See application file for complete search history.

(56) References Cited

U.S. PATENT DOCUMENTS 8,048,737 B2 * 11/2011 Kim et al. ................ 438/253
2007/0173005 A1   7/2007 Lee

FOREIGN PATENT DOCUMENTS

JP   2003078033 A   3/2003
KR   1020080089016 A   10/2008

* cited by examiner

*Primary Examiner* — Jack Chen

(57) ABSTRACT

A semiconductor device includes an active region defined by an isolation region formed in a cell area, buried gates disposed in the active region and the isolation region, conduction layers disposed on the active region and having the same heights as an surface of the isolation region, and a line type storage node contact connected with one of the conduction layers.

4 Claims, 12 Drawing Sheets

SEMICONDUCTOR DEVICE AND METHOD OF MANUFACTURING THE SAME

CROSS-REFERENCES TO RELATED APPLICATION

This application claims priority under 35 U.S.C. 119(a) to Korean application number 10-2009-0120159, filed on Dec. 4, 2009, in the Korean Patent Office, which is incorporated by reference in its entirety as if set forth in full.

BACKGROUND OF THE INVENTION

The present invention relates to a semiconductor device, and more particularly, to a semiconductor device capable of improving a margin of a storage node contact plug and a method of manufacturing the same.

Most electronic appliances today include semiconductor devices. The semiconductor devices include electronic elements such as transistors, resistors and capacitors, etc. The electronic elements are designed to perform partial functions of the electronic appliances which are integrated on a semiconductor substrate. For example, electronic appliances such as computers or digital cameras include memory chips for storing information and processing chips for processing the information control and the memory chips. These processing chips include the electronic elements integrated on the semiconductor substrate.

On the other hands, the semiconductor devices need to be more highly integrated in order to satisfy the high performance and low prices that user's demand. As the integration degree of the semiconductor device is increased, design rules are scaled down and patterns of the semiconductor device are miniaturized. As the semiconductor device becomes largely miniaturized and highly integrated, the total dimension of the chip is increased in proportion to the increment in the memory capacity, but the dimension of a cell area in which patterns of the semiconductor device are formed in is substantially reduced. Accordingly, in order to ensure the desired memory capacity, because many patterns should be formed in the defined area, the fine patterns where the critical dimensions are scaled down should be formed.

Various fine pattern formation methods have been developed to lower the threshold value of the resolution. These methods include a method using a phase shift mask as a photo mask, a Contrast Enhancement Layer (CEL) method which forms a separate layer for improving an image contrast on a thin wafer, a Tri Layer Resister (TLR) method where an intermediate layer such as a spin on glass (SOG) is interposed between two photoresist layers and a silylation method which selectively implants silicons in the upper portion of the photoresist layer.

On the other hands, the contacts for connecting upper and lower interconnections are largely affected by the design rule as compared with the line/space patterns. That is, as the device is highly integrated, the size of the device and the distance between neighboring interconnections are reduced. According to this, the aspect ratio which is the ratio of the depth to the diameter of the contact is increased and it is difficult to form contacts. Therefore, the contact formation process is very important in manufacturing the high integration semiconductor device. Accordingly, when the contact holes are formed in the high integration semiconductor device having multi-layered interconnections, because the accurate and strict alignment is demanded, the process margin is reduced or the process should be performed without margin.

In particular, a self align contact (SAC) fail between the landing plug and a gate or between the landing plug and a recess gate occur in a landing plug formation process so that the yield is lowered. According to this, the technique for preventing the SAC fail with the landing pad by changing a gate or a recess gate structure to a buried gate structure is suggested. However, the SAC fail between the storage node contact plug and a bit line still generated in the buried structure and the disconnection between the storage node contact plug and the landing plug is also generated.

SUMMARY

The inventive concept is to solve problems that the not-open phenomenon at a bottom of a storage node contact plug and a bridge are occurred due to the high integration of a semiconductor device and a contact resistance due to reduction in a contact area with an active region is increased, when the storage node contact plug is formed in a hole type.

According to one aspect of an exemplary embodiment, a semiconductor device includes an active region defined by an isolation region formed in a cell area, buried gates disposed in the active region and the isolation region, conduction layers disposed on the active region and having the same heights as an surface of the isolation region, and a storage node contact plug connected with one of the conduction layers and having a line type parallel with the first buried gates.

The semiconductor device may further comprise an insulating layer disposed over buried gates and the isolation region.

The insulating layer may be comprised of a sealing nitride layer.

The first conduction layer may comprise landing plug pads.

The semiconductor device may further comprise a damascene bit line connected to another one of the conduction layers provided in the active region.

According to another aspect of another exemplary embodiment, a method of manufacturing a semiconductor device includes forming an active region defined by an isolation region, forming buried gates disposed in the active region and the isolation region, forming conduction layers disposed over the active region and having the same heights as an surface of the isolation region, forming a storage node contact plug connected to one of the conduction layers adjacent to the isolation region.

The method may further comprise an insulating layer is formed on the isolation region and above the conduction layers, after the forming conduction layers.

The forming an insulating layer may comprise forming a sealing nitride layer.

The method may further comprise, forming the insulating layer on the conduction layers, forming an interlayer insulating layer having first storage node contact plug regions exposing the insulating layer, forming buried layers in the first storage node contact plug regions, and forming a bit line connected to another one of conduction layers.

The forming the bit line may include forming a damascene trench by etching the buried layer and the interlayer insulating layer to expose another conduction layer disposed in the active region, forming spacers on sidewalls of the trench, and forming a bit line conduction layer connected to the another conduction layer and disposed on sidewalls of the spacers.

The forming a storage node contact plug may include forming a second storage node contact plug region by etching the buried layer and the insulating layer to expose the one conduction layer adjacent to the isolation region and depositing a conduction layer for a storage node within the second storage node contact plug region.

The forming a second storage node contact plug region may include removing the buried layer by using etch selectivity between the buried layer and the interlayer insulating layer.

The inventive concept provides a smooth electrical connection between an active region and a storage node to prevent the increase in resistance and ensures the contact region of the storage node to maximize the structural stability. Accordingly, although the semiconductor device has a fine pitch due to high integration, it prevents the performance of the semiconductor device from being graded.

These and other features, aspects, and embodiments are described below in the section entitled "DESCRIPTION OF EXEMPLARY EMBODIMENT".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF EMBODIMENTS

Figure 1:
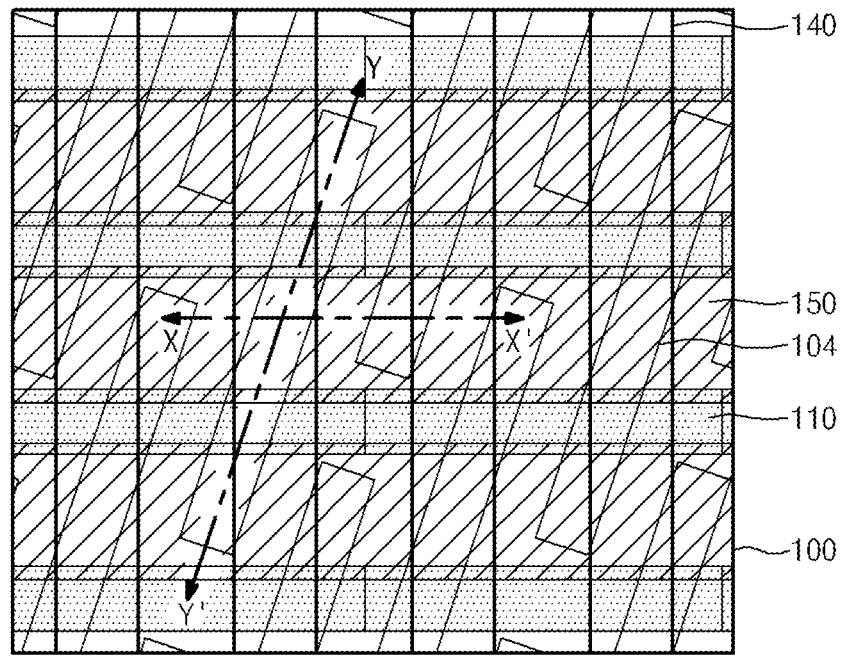
FIG. 1 is a plan view of a semiconductor device according to an embodiment of the inventive concept.

Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other layer or substrate, or intervening layers may also be present.

Figure 2:
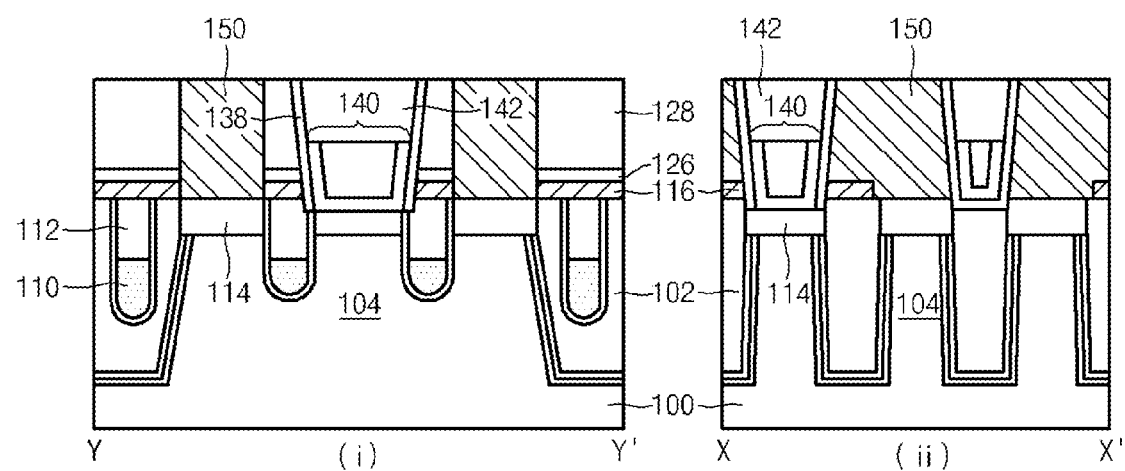
FIG. 2 is a sectional view of the semiconductor device of FIG. 1 according to an embodiment of the inventive concept.
Figure 3A:
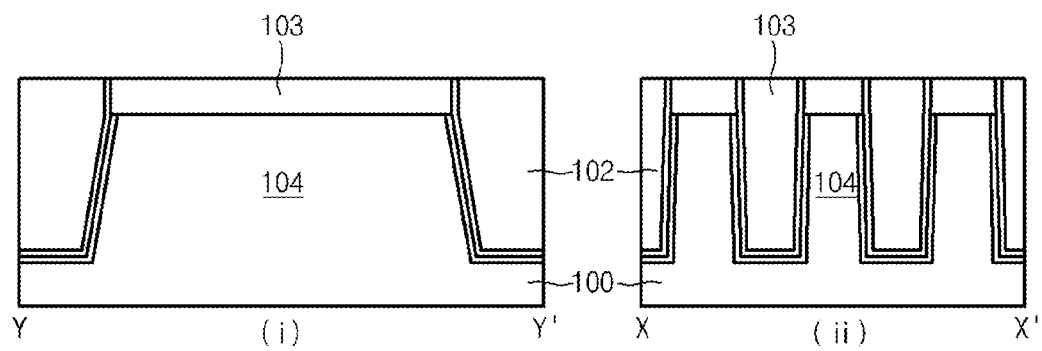
FIGS. 3A through 3Q are sectional views illustrating a method of manufacturing the semiconductor device of FIG. 1 according to an embodiment of the inventive concept, in each of which (i) is a sectional view of a cell area taken along the y-y' line of the FIG. 1 and (ii) is a sectional view of a cell area taken along the x-x' line of FIG. 1.

FIG. 1 is a plan view of a semiconductor device according to an embodiment of the inventive concept. FIG. 2 is a sectional view of the semiconductor device according to an embodiment of the present invention. FIGS. 3A through 3Q are sectional views illustrating a method of manufacturing the semiconductor device of FIG. 1 according to an embodiment of the inventive concept, in each of which (i) is a sectional view of a cell area taken along the y-y' line of FIG. 1 and (ii) is a sectional view of a cell area taken along the x-x' line of FIG. 1.

Referring to FIG. 2, the semiconductor device of the embodiments of the present invention includes an isolation region 102 formed in a semiconductor substrate 100, buried gates 110 which are disposed in the isolation region 102 and an active region 104, conduction layers 114 disposed on the active region 104 and having the same heights as an upper surface of the isolation region 102, a line type damascene bit line 140 connected to the conduction layers 114 disposed at one side of the gate pattern 110, and a line type storage node contact plug 150 connected to the conduction layers 140 disposed at the other side of the gate pattern 110.

As described above, the semiconductor device of the embodiments of the present invention includes the line type storage node contact plug 150 to be smoothly contacted with a storage node so that the characteristic of the semiconductor device can be improved.

Referring to FIG. 3A, a pad oxide layer (not shown) and a pad nitride layer 103 are formed on the semiconductor substrate 100. The pad nitride layer 103, the pad oxide layer and the semiconductor substrate 100 are etched to form a trench (not shown) defining the isolation region 102. Preferably, after a side wall oxide layer, a lining nitride layer and a lining oxide layer are formed on an entire resultant structure including the trench, a spin on dielectric (SOD) layer fills up the trench and then is subject to planarization to form the isolation region 102. Herein, the active region 104 is self-defined by the isolation region 102 formed in the semiconductor substrate 100.

Figure 3B:
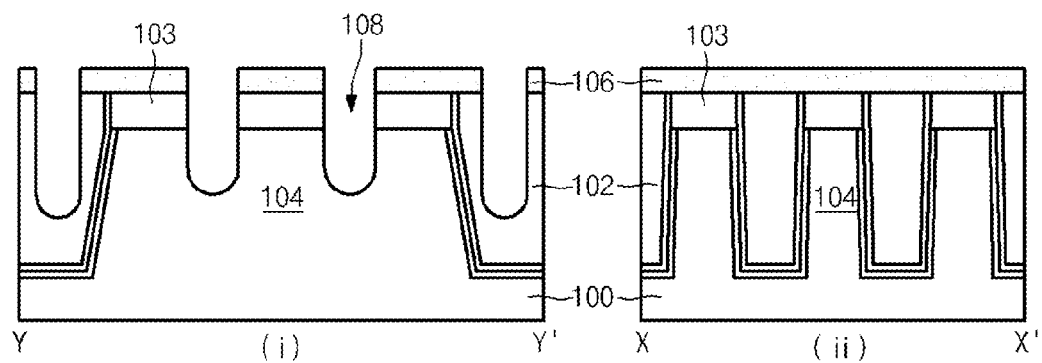

Referring to FIG. 3B, a hard mask pattern 106 is formed on an entire resultant structure including the isolation region 102 and then the active region 104 and the isolation region 102 are etched by using the hard mask pattern 106 as an etch mask to form recesses 108 for a buried gate. Next, the hard mask pattern 106 is removed.

Figure 3C:
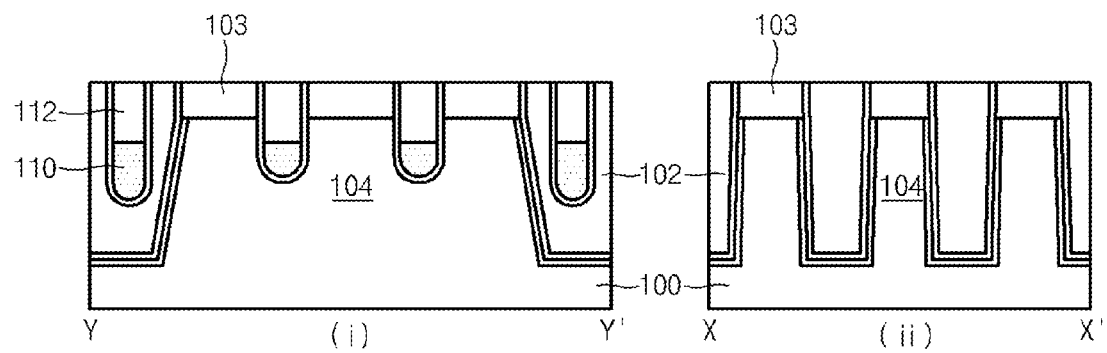

Referring to FIG. 3C, an oxide layer is formed on an entire resultant structure including the recesses 108 and a conduction layer 100 is buried within the recesses 108. The conduction layer is etched back so that a conduction pattern 110 is formed in a lower portion of the recess 108. The conduction pattern 110 may be preferably a stack structure of TiN and W. Next, a capping oxide layer 112 is formed to fill the recesses 108 and then planarized. At this time, the capping oxide layer 112 may be planarized by using a cell open mask so that the capping oxide layer is removed from the cell area (i, ii). Next, the pad nitride layer 103 exposed in the cell area (i, ii) is removed.

Figure 3D:
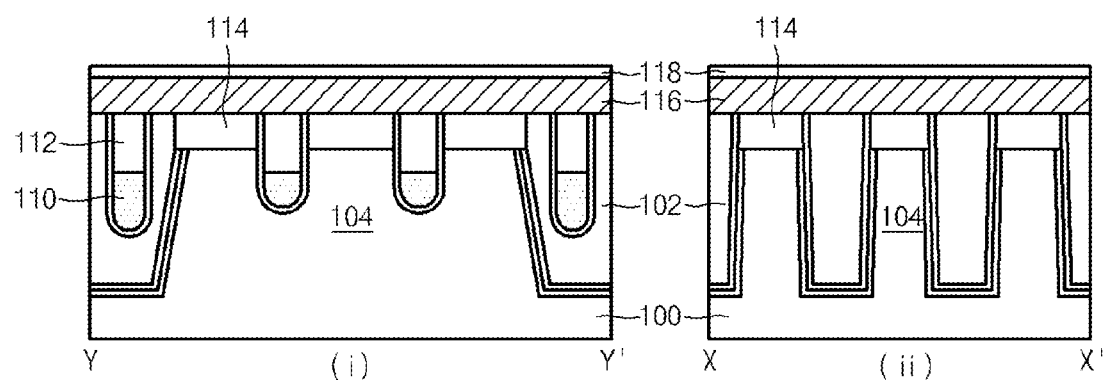
Figure 3E:
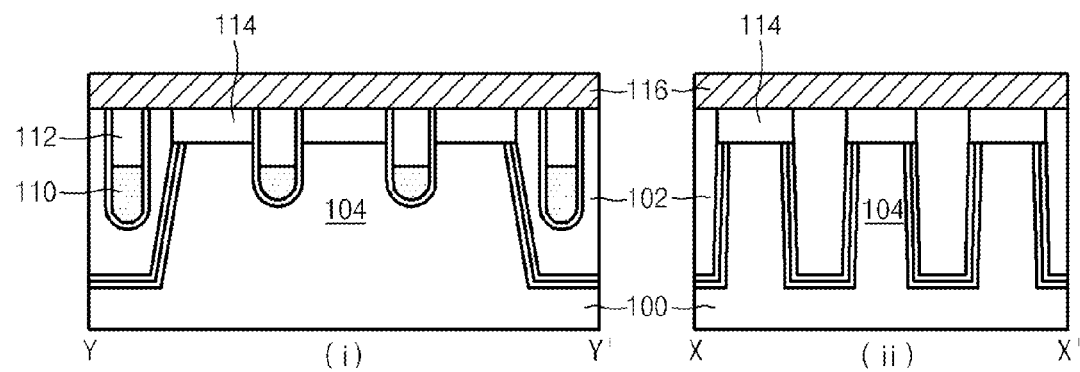

Referring to FIGS. 3D and 3E, a conduction layer 114 is formed on a resultant structure so as to fill the area where the pad nitride layer 103 was present and then planarized until the capping oxide layer 112 is exposed. Subsequently, a sealing nitride layer 116 and a sealing oxide layer 118 are formed on an entire resultant structure (FIG. 3D). Herein, the conduction layer 114 may be preferably a landing plug pad. Then, the sealing oxide layer 118 is removed to expose the sealing nitride layer 116 through a planarization process (FIG. 3E).

Figure 3F:
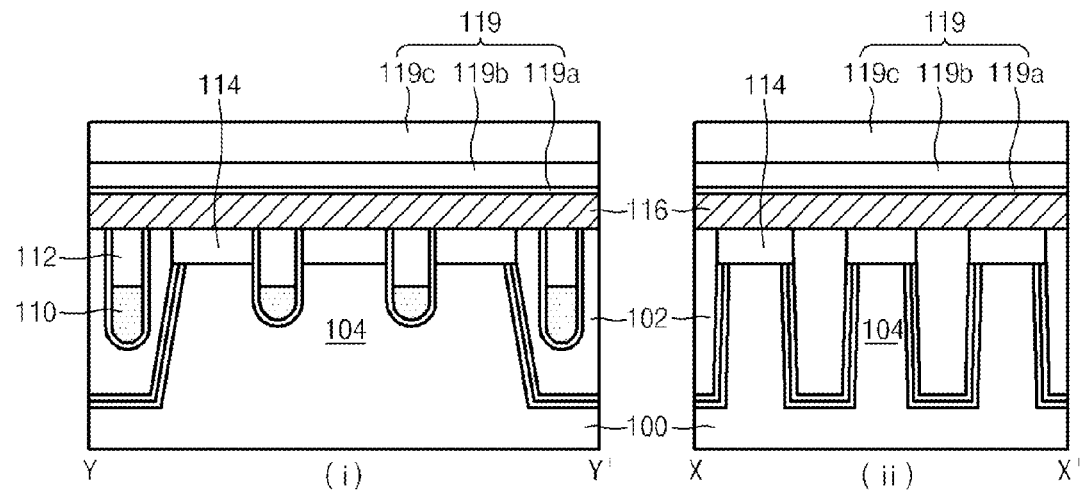

Referring to FIG. 3F, a peri-gate layer 119 is formed on an entire resultant structure. Herein, the gate layer 119 may be preferably formed of a stack structure of a barrier metal 119a, a gate conduction layer 119b and a hard mask layer 119c.

Figure 3G:
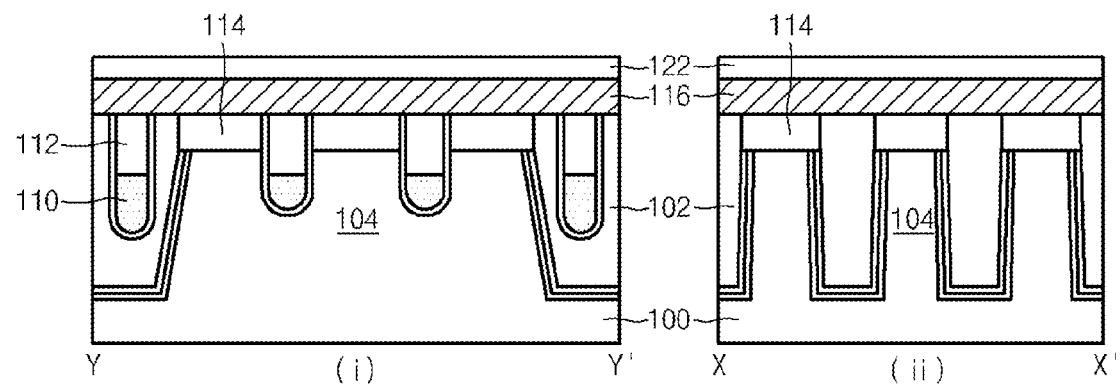

Referring to FIG. 3G, a mask pattern (not shown) is formed on the peri-gate layer 119 using a mask defining a gate line in a peripheral area (not shown) and then the peri-gate layer 119 is etched by the mask pattern as an etch mask to define the gate line (not shown) in the peripheral area. Preferably, at this time, the gate layer 119 formed in the cell area (i, ii) is entirely removed. Subsequently, an oxide layer 122 for a spacer is formed on an entire resultant structure including the peri-gate line.

Figure 3H:
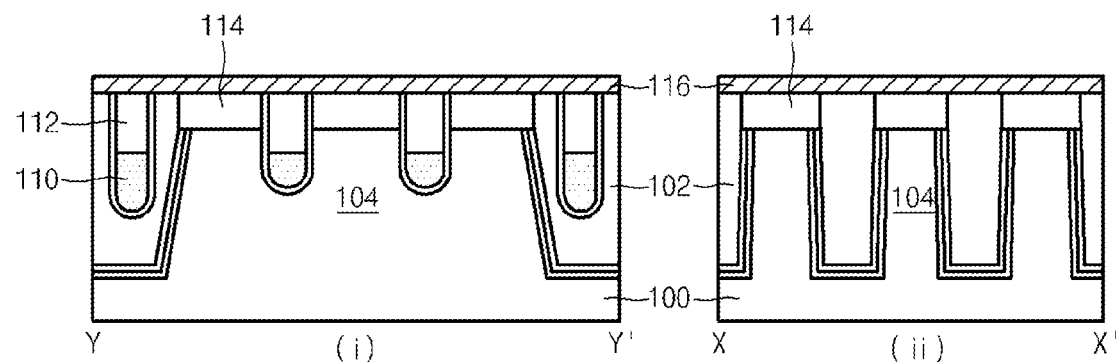
Figure 3I:
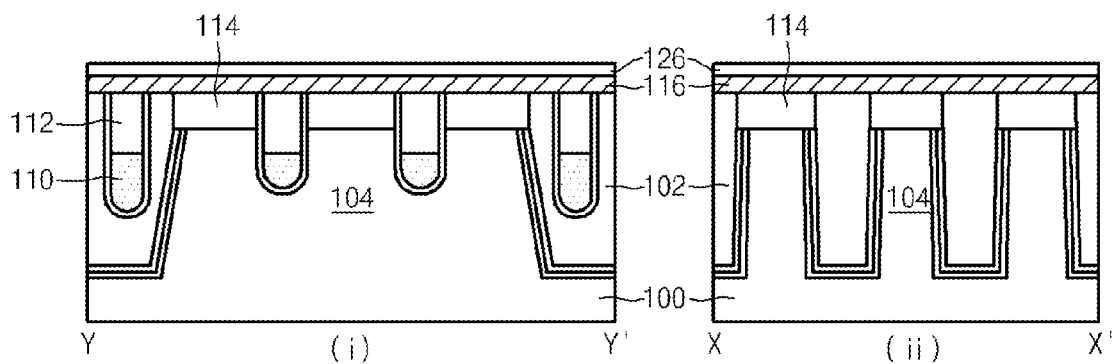

Referring to FIGS. 3H and 3I, the oxide layer 122 for a peri-spacer is etched back to form gate spacers (not shown) on the sidewalls of the peri-gate formed in the peripheral region.

Accordingly, the oxide layer 122 in the cell area (i, ii) is removed (FIG. 3H). Next, an oxide layer 126 is formed on the cell area (i, ii) (FIG. 3I).

Figure 3J:
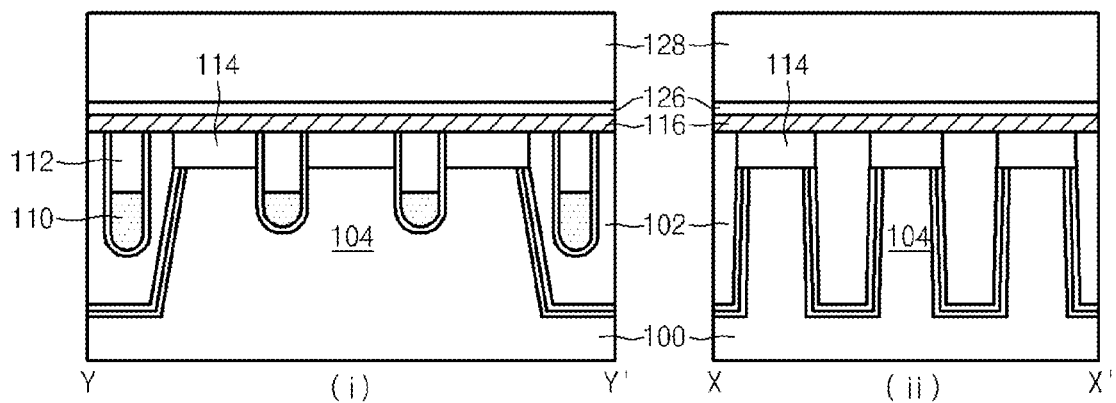
Figure 3K:
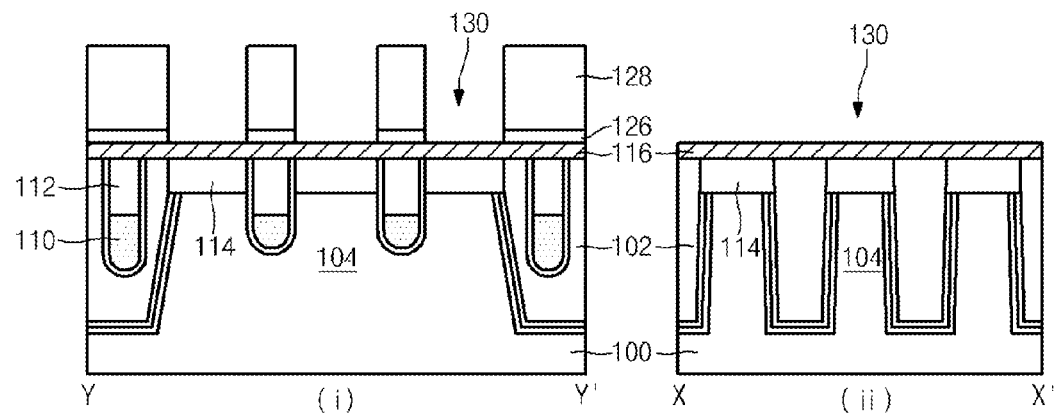

Referring to FIGS. 3J and 3K, an interlayer insulating layer 128 is formed on an entire resultant structure and preferably planarized to expose an upper portion of the peri-gate line in the peripheral area (FIG. 3J). Next, a mask pattern (not shown) for defining a storage node contact plug is formed on the interlayer insulating layer 128 and then the interlayer insulating layer 128 and the oxide layer 126 are etched to expose the sealing nitride layer 116 by using the mask pattern as an etch mask, thereby defining first storage node contact plug formation regions 130 (FIG. 3K).

Herein, the mask pattern may be preferably in a line-and-space type and the spaces between the interlayer insulating layers 128 patterned in a line-and-space type may preferably define the first storage node contact plug formation regions 130. The reason why the first storage node contact plug formation regions 130 are defined to expose the sealing nitride layer 116 is for preventing an electrical short between a bit line and a storage node contact plug due to the misalignment of the bit line which is to be formed in a subsequent process.

Figure 3L:
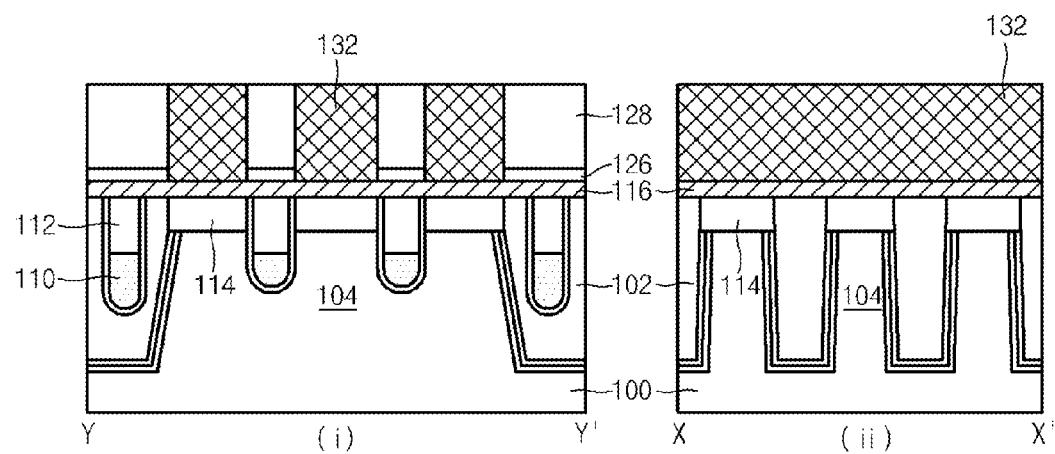

Referring to FIG. 3L, a buried layer 132 is formed on an entire resultant structure to fill the first storage node contact plug formation regions 130 and then planarized to expose the interlayer insulating layer 128. At this time, the buried layer 132 may preferably have an etch sensitivity different from the interlayer insulting layer 128. The buried layer 132 can be removed by using the etch sensitivity difference from the interlayer insulating layer 128.

Figure 3M:
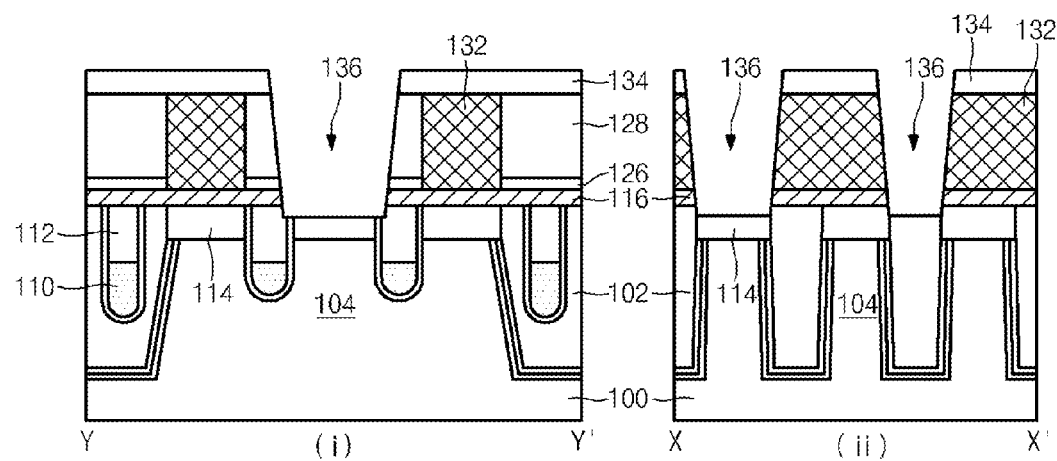

Referring to FIG. 3M, a hard mask layer 134 is formed on an entire resultant structure and a mask pattern (not shown) for defining a damascene bit line is formed on the hard mask layer 134. Subsequently, the hard mask layer 134, the buried layer 132 and side portions of the interlayer insulating layer 128 and the oxide layer 126 and the sealing nitride layer 116 are etched to form a damascene trench 136 by using the mask pattern as an etch mask. Herein, the damascene trench 136 may preferably have a ladder type that an upper side is formed wider than a lower side. Next, the hard mask layer 134 may be preferably removed.

Figure 3N:
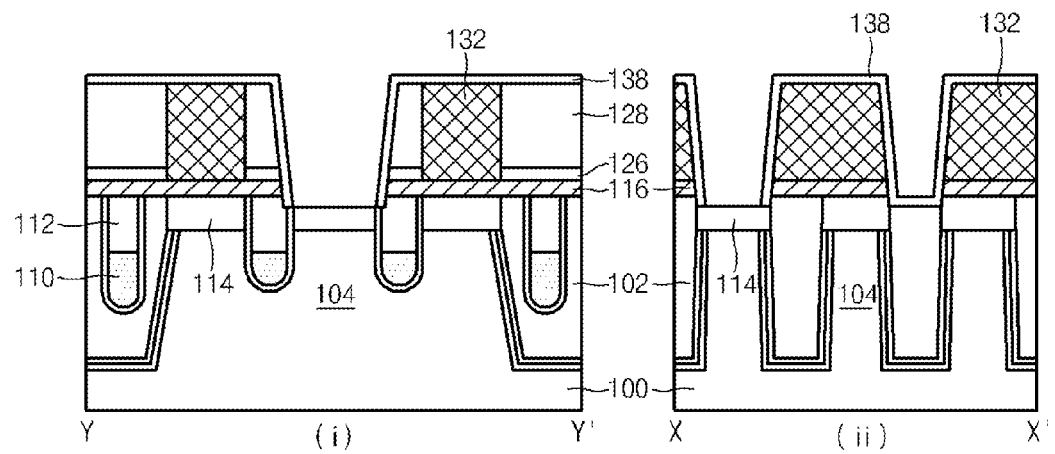
Figure 30:
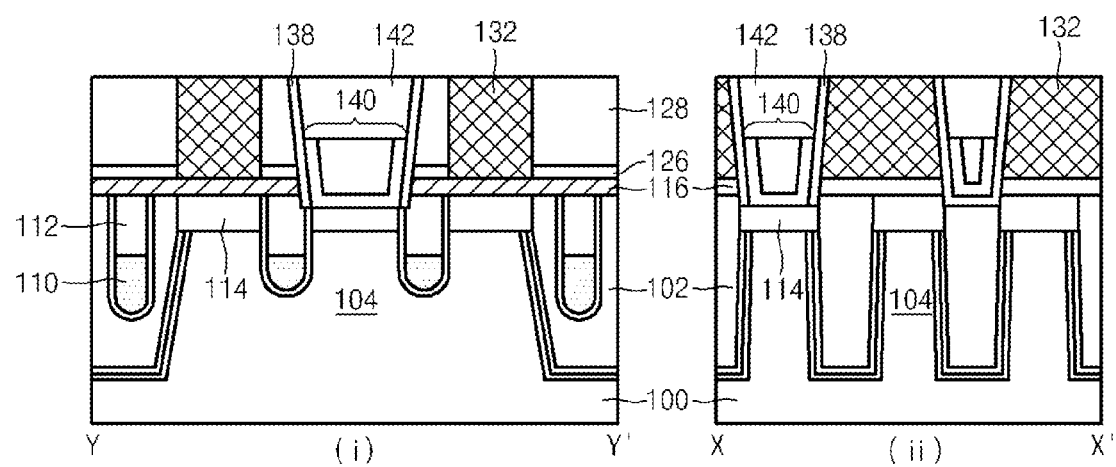

Referring to FIG. 3N, a bit line spacer insulating layer 138 is formed on an entire resultant structure. Herein, the bit line spacer insulating layer 138 may be preferably an oxide layer. Subsequently, the bit line spacer insulating layer 138 which is formed on a bottom of the damascene trench 136 and is contacted with the conduction layers 114 is removed by using a bit line contact mask (not shown).

Referring to FIG. 3O, a glue TiN layer is formed on a portion of an inner surface of the damascene trench 136 and a tungsten layer is formed on an entire resultant structure and then etched back to form a bit line 140 which is buried at the same height as the glue TiN layer. Herein, the glue TIN layer is formed along the bit line spacer insulating layer 138 which is formed on a sidewall of the damascene trench 136 and may preferably have an U shape to be connected with the conduction layer 114. Subsequently, a hard mask layer 142 is formed on the bit line 140 to fill the damascene trench 136 and then planarized to expose the interlayer insulating layer 128.

Figure 3P:
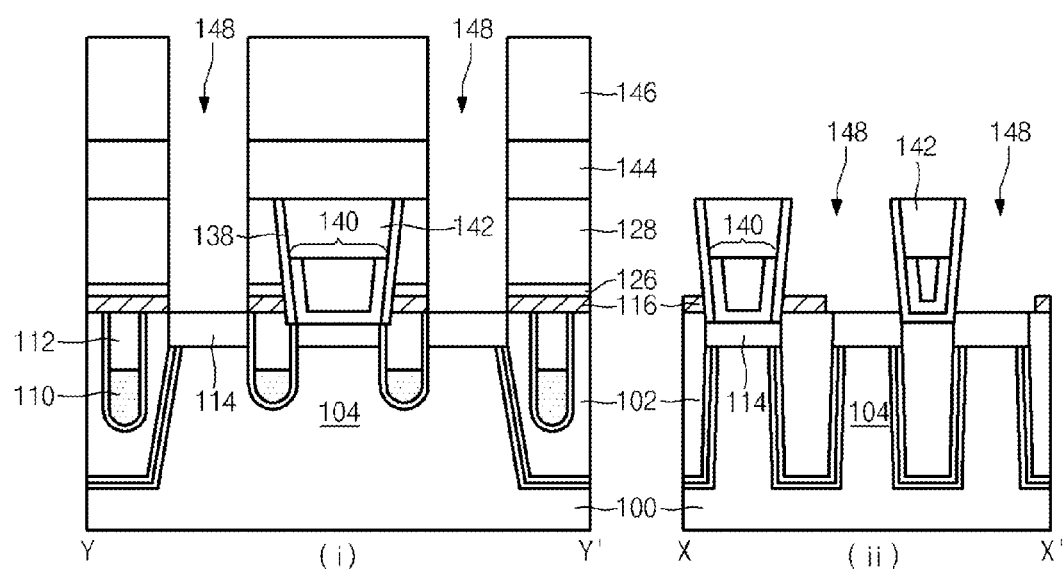
Figure 3Q:
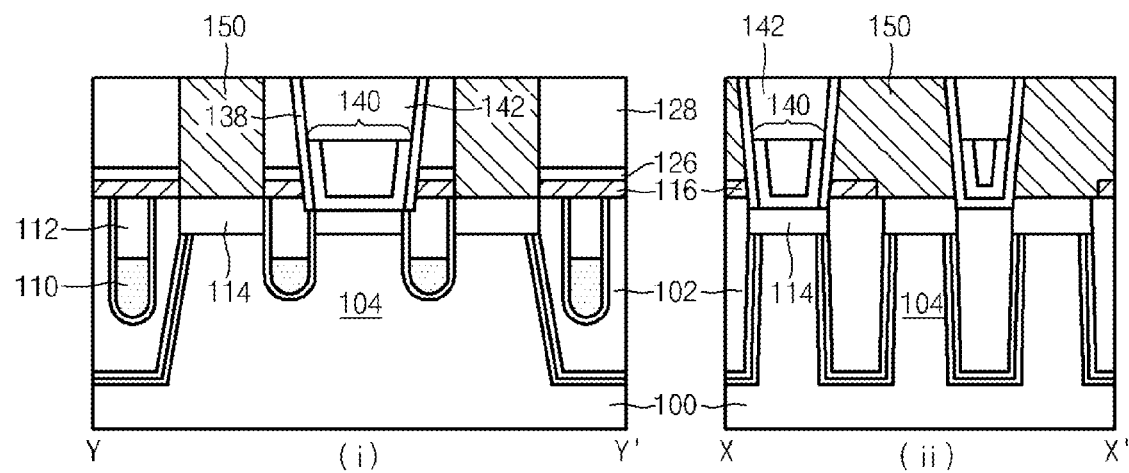

Referring to FIG. 3P, the buried layer 132 is removed by an etch back process and a hard mask layer 144 is formed on an entire resultant structure including a portion where the buried layer 132 is removed. Then a storage node contact plug mask pattern 146 is formed on the hard mask layer 144. Herein, the storage node contact plug mask pattern 146 may be preferably a line type. Subsequently, the hard mask layer 144 and the sealing nitride layer 116 are etched to expose the conduction layer 114 by using the storage node contact plug mask pattern 146 as an etch mask, thereby forming the second storage node contact plug formation regions 148. That is, the second storage node contact plug formation regions 148 are spaced apart from the bit line 140 and the one of the conduction layers 114 connected to the bit line 140 by the sealing nitride layer 116.

Accordingly, although the conduction layer 114 connected to the damascene bit line 140 is exposed by the misalignment of the bit line 140, an electrical bridge between the conduction layers 114 formed in the second storage node contact plug formation region 148 and the storage node contact plug formation region 148 can be prevented by the sealing nitride layer 116. For example, although the storage node contact plug mask pattern 146 is formed so as to be overlapped with the bit line 140 due to the misalignment of the storage node contact plug mask, the second storage node contact plug formation region 148 is not overlapped with the bit line 140. It is because the bit line 140 has a damascene type and is not etched by a profile perpendicular to the storage node contact plug mask pattern 146. That is, the second storage node contact plug formation region 148 is formed with a self-aligned type by etching the hard mask layer 144 and the sealing nitride layer 116 along the sidewalls of the bit line spacer insulating layer 138 so that the conduction layer 114 in the second storage node contact plug formation regions 148 are not directly contacted with the bit line 140. Subsequently, the storage node contact plug mask pattern 146 and the hard mask layer 144 are removed.

Referring to FIG. 3Q, a storage node contact plug conduction layer is formed on an entire resultant structure including the second storage node contact plug formation region 148 and then planarized to form a line type storage node contact plug 150. The storage node contact plug 150 is formed in the second storage node contact plug formation regions 148 (Refer to FIG. 3P) exposing the conduction layers 114 so that the connection between the bit line 140 and the storage node contact plug 150 is basically prevented and the connection between the storage node contact plug 150 and the conduction layer 114 connected to the bit line 140 is also prevented by the sealing nitride layer 116.

As described above, the embodiments of the present invention forms a line type storage node contact plug to be buried between the damascene bit lines so that the area contacted with the storage node can be sufficiently ensured and the increase in the contact resistance can be prevented.

While certain embodiments have been described above, it will be understood that the embodiments described are by way of example only. Accordingly, the devices and methods described herein should not be limited based on the described embodiments. Rather, the systems and methods described herein should only be limited in light of the claims that follow when taken in conjunction with the above description and accompanying drawings.

What is claimed is:
1. A semiconductor device, comprising:
an active region defined by an isolation region formed in a cell area;
buried gates disposed in the active region and the isolation region;
conduction layers disposed on the active region and having the same heights as the isolation region;
a storage node contact plug connected with one of the conduction layers and having a line type parallel with the buried gates; and a damascene bit line connected to another one of the conduction layers disposed on the active region and formed in a ladder type having an upper portion wider than a lower portion.

2. The semiconductor device of claim 1, the device further comprising an insulating layer over the buried gates and the isolation region.

3. The semiconductor device of claim 2, wherein the insulating layer comprises a sealing nitride layer provided between the storage node contact plug and the damascene bit line.

4. The semiconductor device of claim 2, wherein the conduction layers comprise a landing plug pad.

* * * * *